United States Patent
Choi et al.

(10) Patent No.: US 9,034,742 B2
(45) Date of Patent: May 19, 2015

(54) METHOD FOR FABRICATING SEMICONDUCTOR DEVICE

(71) Applicant: SAMSUNG ELECTRONICS CO., LTD., Suwon-Si, Gyeonggi-Do (KR)

(72) Inventors: Suk-Hun Choi, Gyeonggi-do (KR); Chan-Sam Chang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 53 days.

(21) Appl. No.: 14/046,324

(22) Filed: Oct. 4, 2013

(65) Prior Publication Data

US 2015/0099351 A1    Apr. 9, 2015

(51) Int. Cl.
  *H01L 21/266* (2006.01)
  *H01L 21/308* (2006.01)
  *H01L 21/3065* (2006.01)

(52) U.S. Cl.
  CPC .......... *H01L 21/266* (2013.01); *H01L 21/3081* (2013.01); *H01L 21/3065* (2013.01)

(58) Field of Classification Search
  CPC ..................................... H01L 21/266
  USPC .................................. 438/514–534
  See application file for complete search history.

(56) References Cited

U.S. PATENT DOCUMENTS

| 6,180,560 | B1 | 1/2001 | Hayakawa et al. |
| 6,730,610 | B1 * | 5/2004 | Sun et al. ................ 438/706 |
| 2009/0117744 | A1 | 5/2009 | Lee et al. |
| 2011/0164161 | A1 | 7/2011 | Back |

FOREIGN PATENT DOCUMENTS

| JP | 2004281967 | 10/2004 |
| JP | 2008243905 | 10/2008 |
| JP | 2011227223 | 11/2011 |
| KR | 1020020045453 | 6/2002 |
| KR | 1020060056707 | 5/2006 |
| KR | 1020070024990 | 3/2007 |
| KR | 100723000 | 5/2007 |
| KR | 1020080004215 | 1/2008 |

* cited by examiner

*Primary Examiner* — Daniel Shook
(74) *Attorney, Agent, or Firm* — F. Chau & Associates, LLC

(57) ABSTRACT

A method for fabricating a semiconductor device is provided. An ion implantation mask exposing a portion of a semiconductor substrate is formed on the semiconductor substrate. The implantation mask includes a second hardmask layer having a first thickness and a second hardmask layer having a second thickness. The first hardmask layer is disposed between the second hardmask layer and the semiconductor substrate. An ion implantation process is performed on the exposed portion of the semiconductor substrate using the implantation mask. The implantation mask is removed without forming an etch mask layer on the exposed portion of the semiconductor substrate.

20 Claims, 12 Drawing Sheets

US 9,034,742 B2

METHOD FOR FABRICATING SEMICONDUCTOR DEVICE

TECHNICAL FIELD

The present inventive concept relates to a method for fabricating a semiconductor device.

DISCUSSION OF RELATED ARTS

In manufacturing semiconductor devices, impurities may be doped in regions of semiconductor devices by performing doping processes. Doped regions have different electrical properties depending on the type of impurities doped therein. Doping processes may include an ion implantation process or a thermal diffusion process. An ion implantation process may easily control doping profiles.

SUMMARY

According to an exemplary embodiment of the inventive concept, a method for fabricating a semiconductor device is provided. First and second hardmask layers are sequentially formed on a silicon substrate. The first hardmask layer includes a material different from the second hardmask layer. A portion of the substrate is exposed by patterning the first and second hardmask layers through a first etching process. An ion implantation process is performed on the exposed portion of the substrate. The patterned second and first hardmask layers are removed through a second etching process different from the first etching process while the substrate is exposed.

According to an exemplary embodiment of the inventive concept, a method for fabricating a semiconductor device is provided. First and second hardmask layers are sequentially formed on a semiconductor substrate having a passivation layer. The passivation layer is formed on top surfaces of the semiconductor substrate in first and second regions. The first hardmask layer includes a material different from the second hardmask layer. The first and second hardmask layers are patterned to expose the passivation layer in the first region. The patterned first hardmask layer covers the passivation layer in the second region. First impurity ions are implanted into the substrate using the patterned first and second hardmask layers as an implantation mask. The patterned second and first hardmask layers are removed by using an etchant having etching selectivity of the patterned second and first hardmask layers with respect to the passivation layer.

According to an exemplary embodiment of the inventive concept, a method for fabricating a semiconductor device is provided. An ion implantation mask exposing a portion of a semiconductor substrate is formed on the semiconductor substrate. The implantation mask includes a first hardmask layer having a first thickness and a second hardmask layer having a second thickness. The first hardmask layer is disposed between the second hardmask layer and the semiconductor substrate. An ion implantation process is performed on the exposed portion of the semiconductor substrate using the implantation mask. The implantation mask is removed without forming an etch mask layer on the exposed portion of the semiconductor substrate.

BRIEF DESCRIPTION OF THE DRAWINGS

These and other features and aspects of the present inventive concept will become more apparent by describing in detail exemplary embodiments thereof with reference to the accompanying drawings in which.

DETAILED DESCRIPTION OF EXEMPLARY EMBODIMENTS

Figure 1:
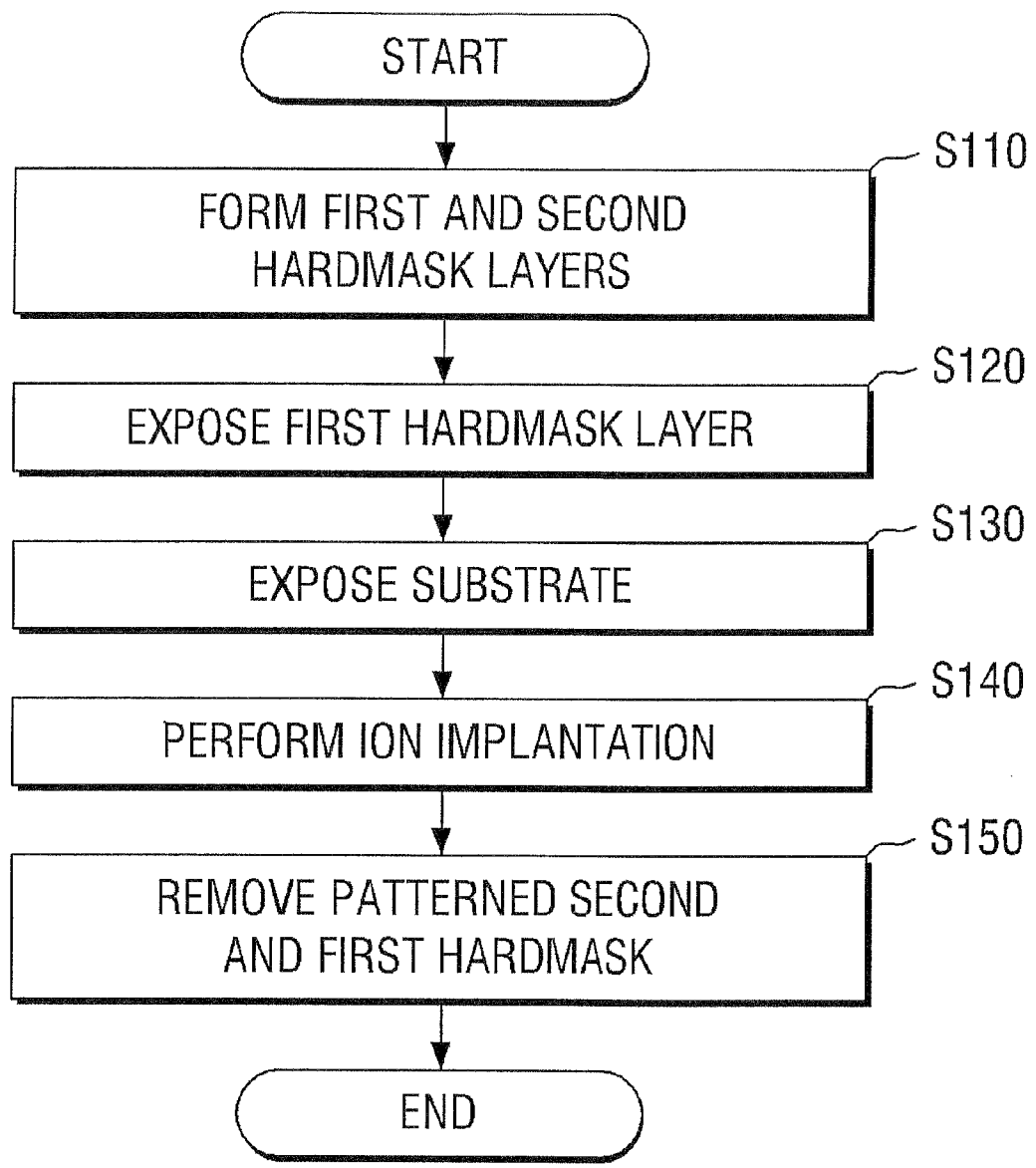
FIG. 1 is a flowchart illustrating a method for fabricating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings.

Hereinafter, a method for fabricating a semiconductor device according to an exemplary embodiment of the present inventive concept will be described with reference to FIGS. 1 to 8.

FIG. 1 is a flowchart illustrating a method for fabricating a semiconductor device according to an exemplary embodiment of the present inventive concept, and FIGS. 2 to 8 are cross-sectional views illustrating process steps according to the flowchart of FIG. 1.

Figure 2:
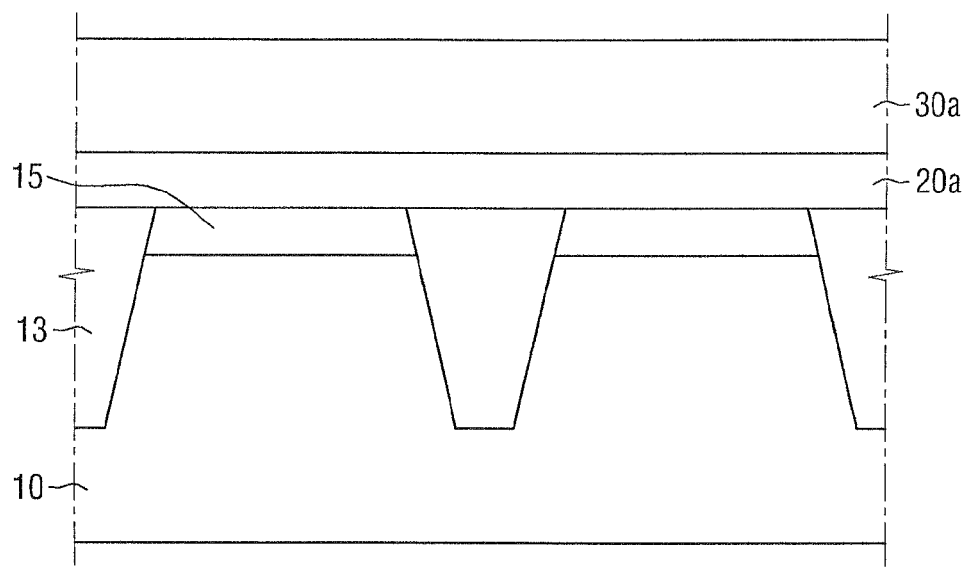
FIGS. 2 to 8 are cross-sectional views illustrating process steps according to the flowchart of FIG. 1.
Figure 3:
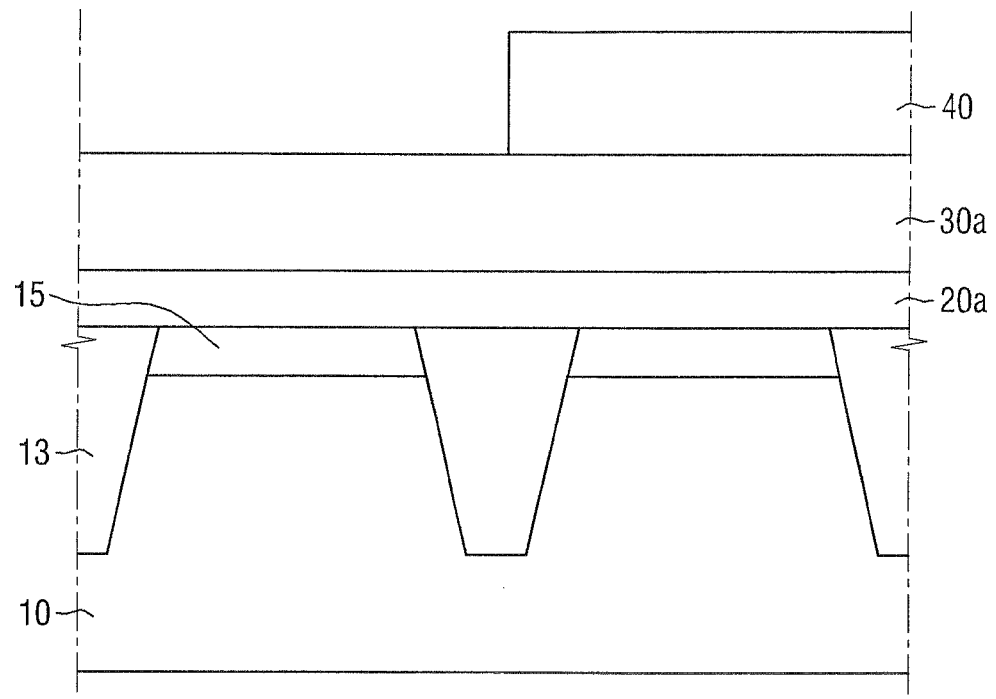
Figure 4:
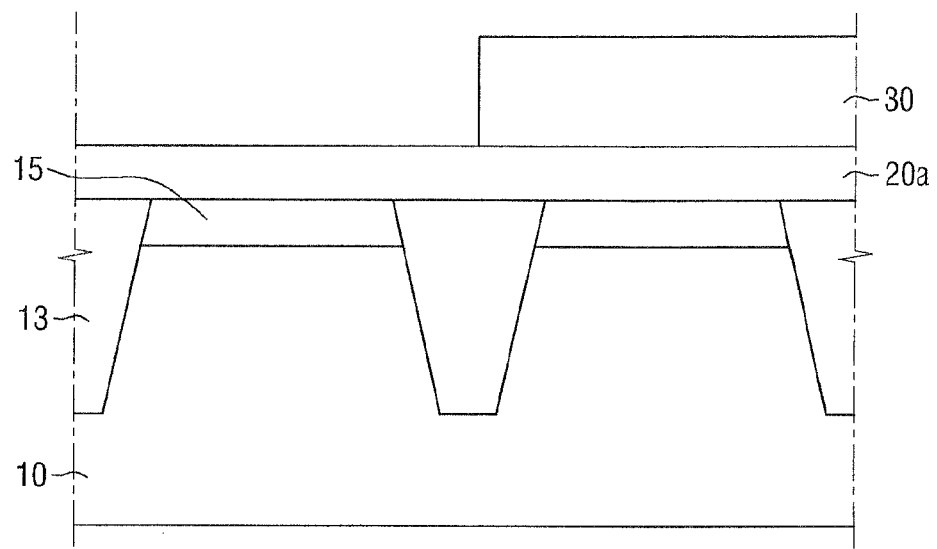

Referring to FIGS. 1 and 2, in S110, a first hardmask layer 20a and a second hardmask layer 30a are sequentially formed on a substrate 10. In an exemplary embodiment, the first hard mask layer 20a may include a material different from that of the second hardmask layer 30a.

The substrate 10 may include a bulk silicon substrate or a silicon-on-insulator (SOI) substrate. Alternatively, the substrate 10 may include, but is not limited to, germanium, indium antimonide, lead telluride, indium arsenide, indium phosphide, gallium arsenide, or gallium antimonide.

The substrate 10 may have an active region defined by an isolation region 13, such as a shallow trench isolation (STI) region.

A passivation layer 15 is formed on a top surface of the active region disposed in the substrate 10. The passivation layer 15 may protect the substrate 10 by preventing the substrate 10 from being damaged in a subsequent process. A thickness of the passivation layer 15 may vary according to the use and fabricating process of the semiconductor device. The passivation layer 15 may include, for example, a silicon oxide ($SiO_2$) layer.

Next, a first hardmask layer 20a is formed on the substrate 10, and a second hardmask layer 30a is formed on the first hardmask layer 20a.

The first hardmask layer 20a may include a spin on hardmask (SOH) or a carbon polymer layer. The first hardmask layer 20a may be formed to have a thickness of, for example, 50 nm or less. If the thickness of the first hardmask layer 20a is less than 50 nm, the first hardmask layer 20a may be rapidly removed in a subsequent removal process.

The second hardmask layer 30a may include SiN, amorphous silicon or polysilicon. The second hardmask layer 30a may be formed to have a thickness of, for example, 200 nm or less. In the case that a photoresist layer is formed on the first hardmask layer 20a, the photoresist needs to be formed to have a thickness of at least 500 nm. Accordingly, the second hardmask layer 30a may include patterns having a smaller aspect ratio compared to the case where a photoresist layer is used. The thickness of the second hardmask layer 30a may vary according to the use and property of the semiconductor device manufactured. Thus, the present inventive concept does not limit the thickness of the second hardmask layer 30a to approximately 200 nm.

Referring to FIGS. 1 and 3 to 5, in S120, the second hardmask layer 30a is patterned using a first etching process to expose the first hardmask layer 20a. For example, referring to FIG. 3, a preliminary photoresist layer is formed on the second hardmask layer 30a and is patterned to form a patterned photoresist layer 40 using a photolithography process. The patterned photoresist layer 40 exposes a portion of the second hardmask layer 30a to be removed. Next, the second hardmask layer 30a is patterned in the first etching process using the patterned photoresist layer 40 as an etch mask, thereby forming the patterned second hardmask layer 30 shown in FIG. 4. The patterned photoresist layer 40 may be removed when the second hardmask layer 30a is patterned. For example, the patterning of the second hardmask layer 30a and the removing of the patterned photoresist layer 40 may be simultaneously performed through the first etching process. Therefore, an additional process for removing the patterned photoresist layer 40 may be omitted.

The first hardmask layer 20a may prevent the substrate 10 and the passivation layer 15 from being damaged when the second hardmask layer 30a is patterned. If the first hardmask layer 20a is not formed, a portion of the substrate 10 or the passivation layer 15 may be etched when the first etching process is performed. According to an exemplary embodiment, the first hardmask layer 20a is formed between the passivation layer 15 and the second hardmask layer 30a, and thus the first hardmask layer 20a may protect the substrate 10 and the passivation layer 15 underneath the first hardmask layer 20a from etchants used in the first etching process.

Figure 5:
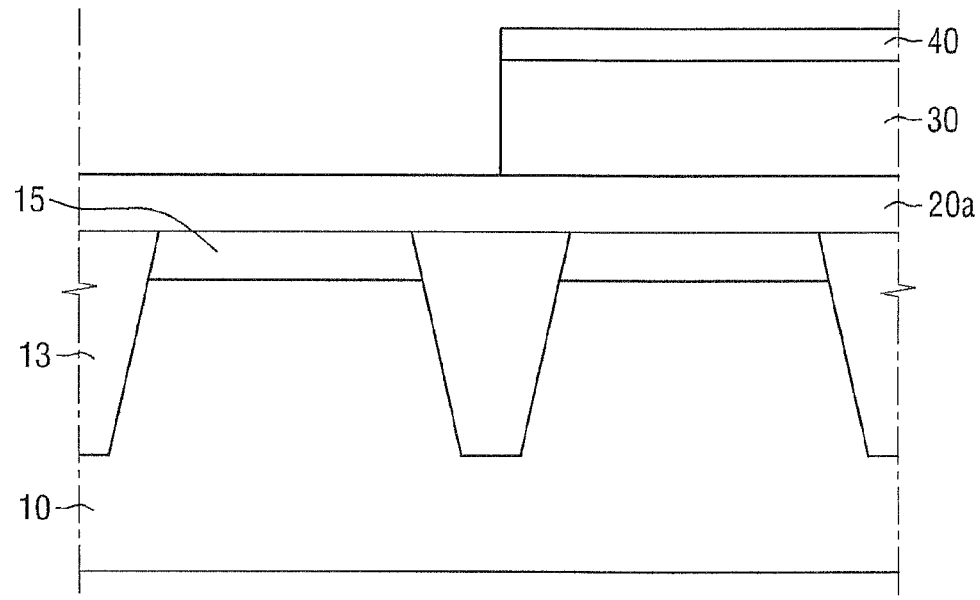

In an exemplary embodiment, after the second hardmask layer 30a is patterned, the patterned photoresist layer 40 may remain on the patterned second hardmask layer 30, as shown in FIG. 5. The remaining photoresist layer 40 is completely removed when the first hardmask layer 20a is patterned in a later process. Accordingly, a separate, additional process for removing the patterned photoresist layer 40 need not be required.

Figure 6:
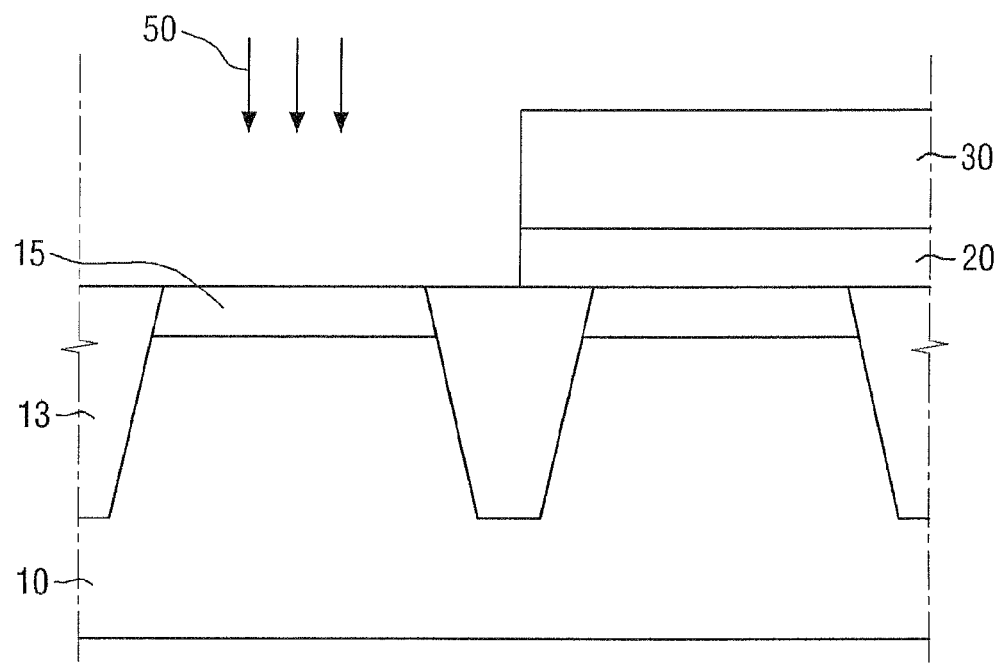

Next, referring to FIGS. 1 and 6, in S130, the exposed first hardmask layer 20a is patterned using the first etching process, thereby exposing the substrate 10. The second hardmask layer 30a is patterned to expose a portion of the first hardmask layer 20a. The first etching process is performed on the exposed first hardmask layer 20a, thereby exposing the substrate 10 through patterned first and second hardmask layers 20 and 30.

The second and first hardmask layers 30a and 20a are patterned using the first etching process. The first etching process may include a dry etching process, for example, a reactive ion etching (RIE) process. Through the use of the RIE process, a pattern of the patterned photoresist layer 40 may be accurately transferred on the second and first hardmask layers 30a and 20a.

Next, in S140, impurity ions are implanted into the exposed substrate 10 using an ion implantation process 50. Here, portions of the substrate 10 covered by the patterned first hardmask layer 20 and the patterned second hardmask layer 30 are not exposed, so that impurity ions are not implanted thereto. The patterned first hardmask layer 20 and the patterned second hardmask layer 30 serve as ion implantation masks.

Figure 7:
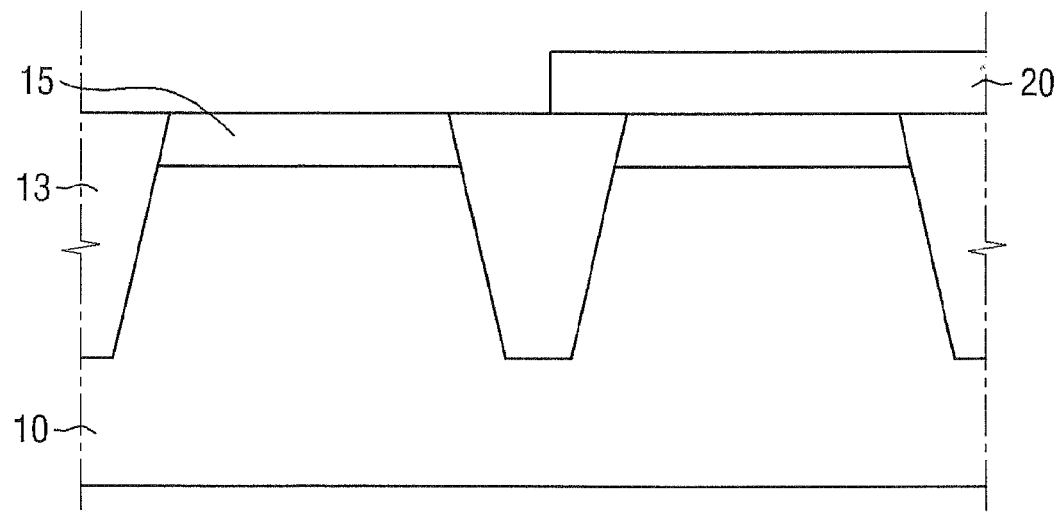
Figure 8:
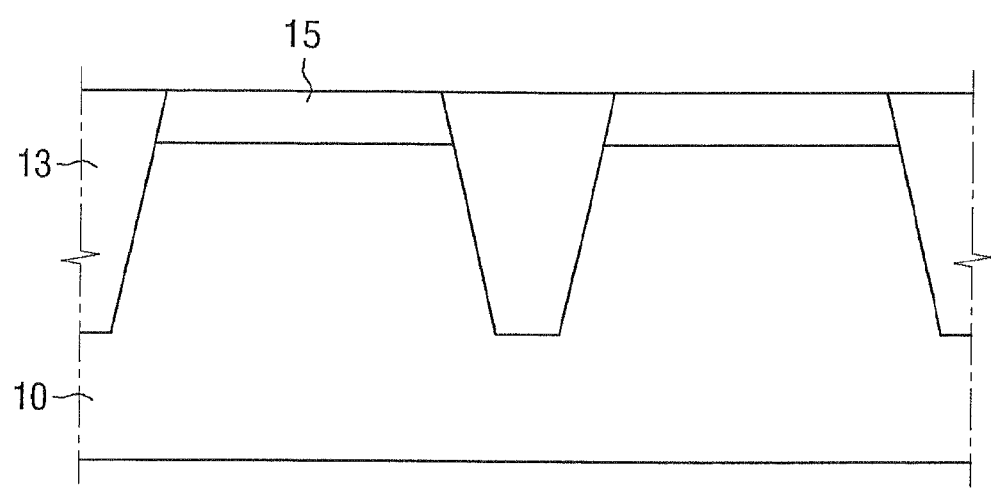

Next, referring to FIGS. 1, 7 and 8, in S150, the patterned second and first hardmask layers 30 and 20 are sequentially removed by a second etching process having an etching condition and/or etchants different from that of the first etching process.

Referring to FIG. 7, the patterned second hardmask layer 30 is removed without forming an etch mask on the exposed substrate 10. The second etching process which is different from the first etching process using a dry etching may include, for example, a wet etching process.

In the second etching process, an etch mask for protecting the exposed substrate 10 is not formed on the exposed substrate 10 to protect the passivation layer 15. Reduction in the number of process steps may reduce fabrication costs. The second etching process may remove the patterned hardmask layer 30 using an etchant having high etch selectivity with respect to the passivation layer 15 and/or the substrate 10.

The etchant used in the second etching process may vary according to a material included in the patterned second hardmask layer 30. For example, if the second hardmask layer 30 includes SiN, the etchant used to remove the patterned second hardmask layer 30 may include $H_3PO_4$, and Si in a concentration of 100 parts-per-million (ppm) or greater. If the second hardmask layer 30 includes Si in an amount of 100 ppm or greater, the etchant has relatively high etching selectivity, so that the substrate 10 and the passivation layer 15 may be substantially unetched and damage in the second etching process may be substantially avoided.

If the second hardmask layer 30 includes amorphous silicon or polysilicon, an etchant used to remove the patterned second hardmask layer 30 may include $NH_4OH$, tetramethyl ammonium hydroxide (TMAH), or tetraethyl ammonium hydroxide (TMEH).

If the etchant include $NH_4OH$, TMAH, or TMEH, the substrate 10 and the passivation layer 15 may be substantially unetched and undamaged when the patterned second hardmask layer 30 is removed.

Next, referring to FIG. 8, the first hardmask layer 20 is removed without forming an etch mask on the exposed substrate 10 to protect the passivation layer 15.

For example, if the first hardmask layer 20 includes a spin on hardmask (SOH) or a carbon polymer layer, an etchant used to remove the patterned first hardmask layer 20 may include $H_3PO_4$. Here, the second etching process may be performed at a high temperature.

In an exemplary embodiment, the patterned first hardmask layer 20 may be removed by an ashing process. The ashing process may also be performed without forming an etch mask on the substrate 10 and the passivation layer 15. In the ashing process, the exposed substrate 10 and the passivation layer 15 are substantially undamaged.

A method for fabricating a semiconductor device according to an exemplary embodiment of the present inventive concept will be described with reference to FIGS. 9 to 15. A description of process steps substantially similar to those described above will be omitted, and the following description will focus on differences between embodiments.

Figure 9:
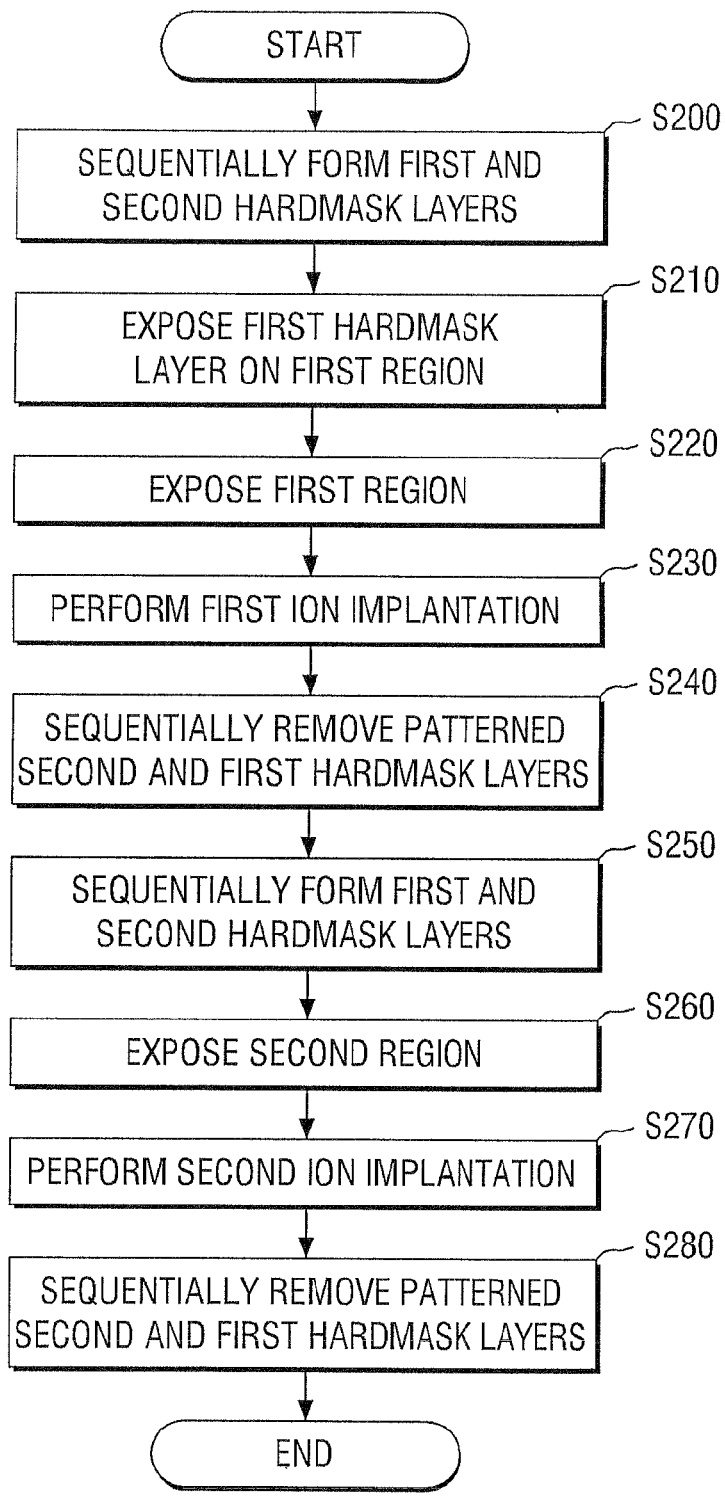
FIG. 9 is a flowchart illustrating a method for fabricating a semiconductor device according to an exemplary embodiment of the present inventive concept.

FIG. 9 is a flowchart for explaining a method for fabricating a semiconductor device according to an exemplary embodiment of the present inventive concept, and FIGS. 10 to 15 are cross-sectional views illustrating process steps of the method for fabricating a semiconductor device shown in FIG. 9.

Figure 10:
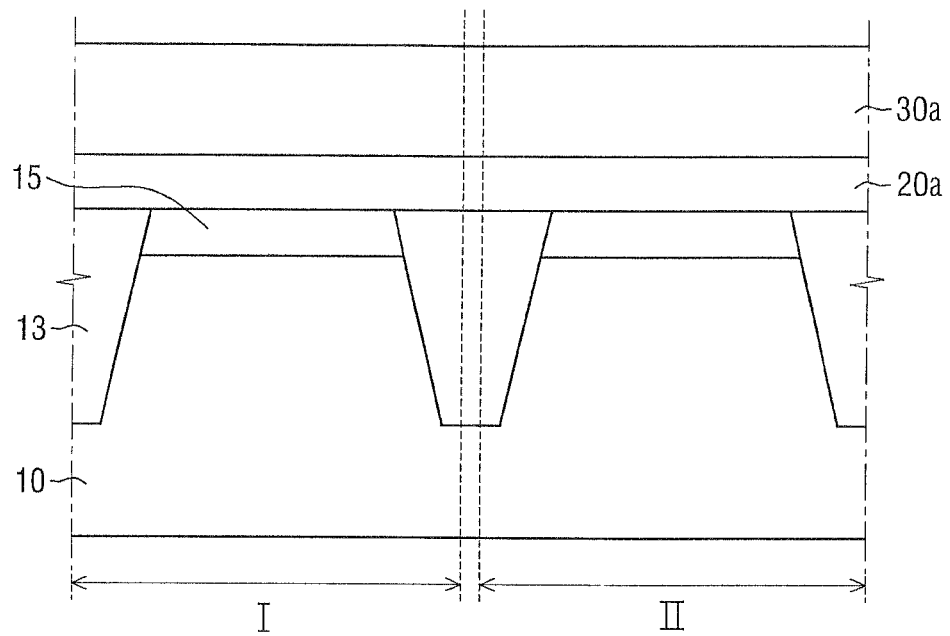
FIGS. 10 to 15 are cross-sectional views illustrating process steps according to the flowchart of FIG. 9.

Referring to FIGS. 9 and 10, in 5200, first and second hardmask layers 20a and 30a, which are different from each other, are sequentially formed on a substrate 10 having a passivation layer 15 formed on first and second regions I and II.

The substrate 10 may include the first region I and the second region II. Since impurity ions to be later implanted into the first region I and the second region II are different from each other, the first region I and the second region II, resulting after an ion implantation process is performed, may have different characteristics.

The substrate 10 may include the passivation layer 15 formed on a top surface of the substrate 10. The passivation layer 15 may include a silicon oxide layer, and may prevent the substrate 10 from being damaged in a subsequent process.

Next, a first hardmask layer 20a is formed on the substrate 10, and a second hardmask layer 30a is formed on the first hardmask layer 20a.

Figure 11:
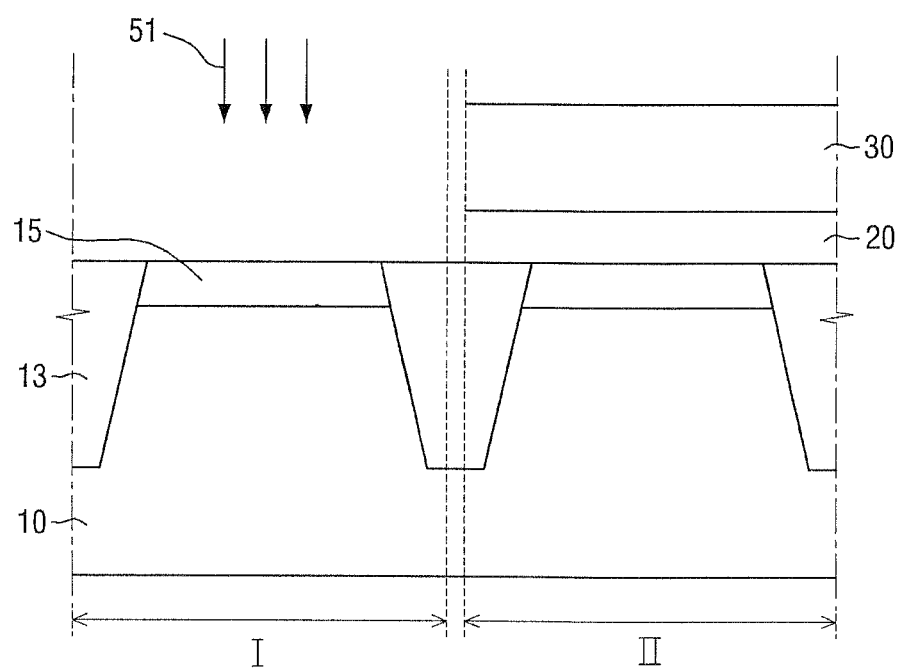

Next, referring to FIGS. 9 and 11, in 5210, the second hardmask layer 30a is patterned to expose the first hardmask layer 20a on the first region I. To pattern the second hardmask layer 30a, a photoresist layer may be formed on the second hardmask layer 30a and then patterned. Then, the second hardmask layer 30a disposed on the first region I may be removed using the patterned photoresist layer. When the second hardmask layer 30a is removed, the patterned photoresist layer may also be removed. The second hardmask layer 30a on the first region I is removed, and a patterned second hardmask layer 30 is formed on the second region II. A reactive ion etching (RIE) process may be used to pattern the second hardmask layer 30a.

Next, in S220, the exposed first hardmask layer 20a is patterned to expose the first region I of the substrate 10. The second hardmask layer 30a is patterned to expose the first hardmask layer 20a of the first region I, and the first hardmask layer 20a of the exposed first region I is removed to expose the substrate 10 of the first region I. If the first hardmask layer 20a of the exposed first region I is removed, the patterned first hardmask layer 20 is formed on the second region II. An RIE process may be performed to pattern the second hardmask layer 20a.

Consequently, the patterned second hardmask layer 30 and the patterned first hardmask layer 20 expose the substrate 10 in the first region I.

Next, in S230, first impurity ions are implanted into the exposed substrate 10. A first ion implantation process 51 is performed on the substrate 10 of the first region I using the patterned first hardmask layer 20 and the patterned second hardmask layer 30 as an implantation mask which prevents the first impurity ions from being implanted into the substrate 10 of the second region II. The patterned first hardmask layer 20 and the patterned second hardmask layer 30 may serve as an implantation mask for the first ion implantation process 51.

Figure 12:
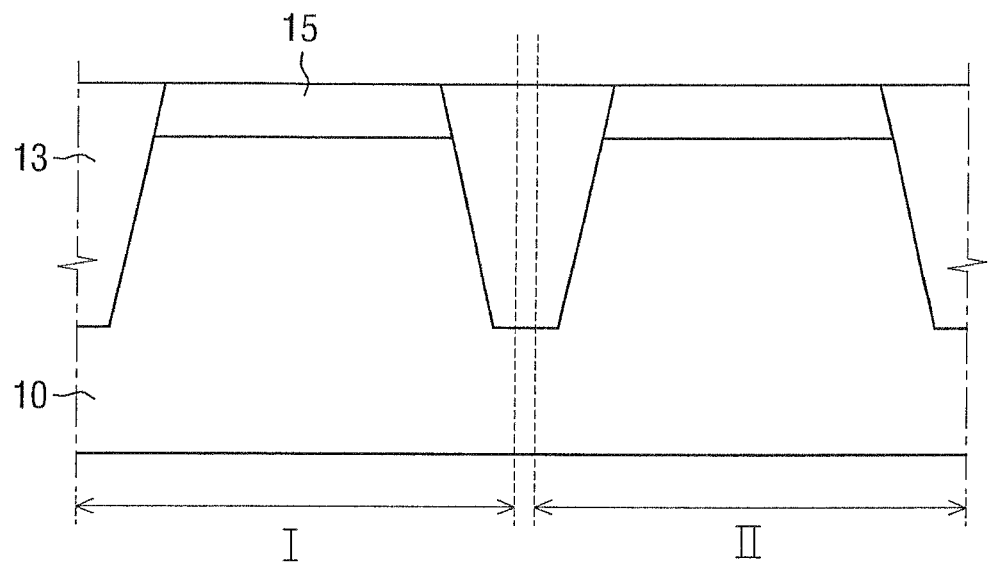

Next, referring to FIGS. 9 and 12, in S240, the patterned second and first hardmask layers 30 and 20 are sequentially removed by using etching selectivity of the passivation layer 15 with respect to the patterned second and first hardmask layers 30 and 20. After the patterned second hardmask layer 30 is removed, the patterned first hardmask layer 20 is removed. A wet etching process may be employed to remove the patterned second hardmask layer 30 and the patterned first hardmask layer 20. As described above, materials forming the patterned first hardmask layer 20 and the patterned second hardmask layer 30 are different from each other. Therefore, in the case of using the wet etching process, etchants used to remove the patterned first hardmask layer 20 and the patterned second hardmask layer 30 may be different from each other, as described above. The etchants used to remove the patterned first hardmask layer 20 and the patterned second hardmask layer 30 may leave the passivation layer 15 substantially unetched. Therefore, the substrate 10 is not damaged by the etchant.

Meanwhile, the patterned first hardmask layer 20 may be removed by an ashing process other than the wet etching process. Like the wet etching process, the ashing process may leave the substrate 10 substantially unetched.

Figure 13:
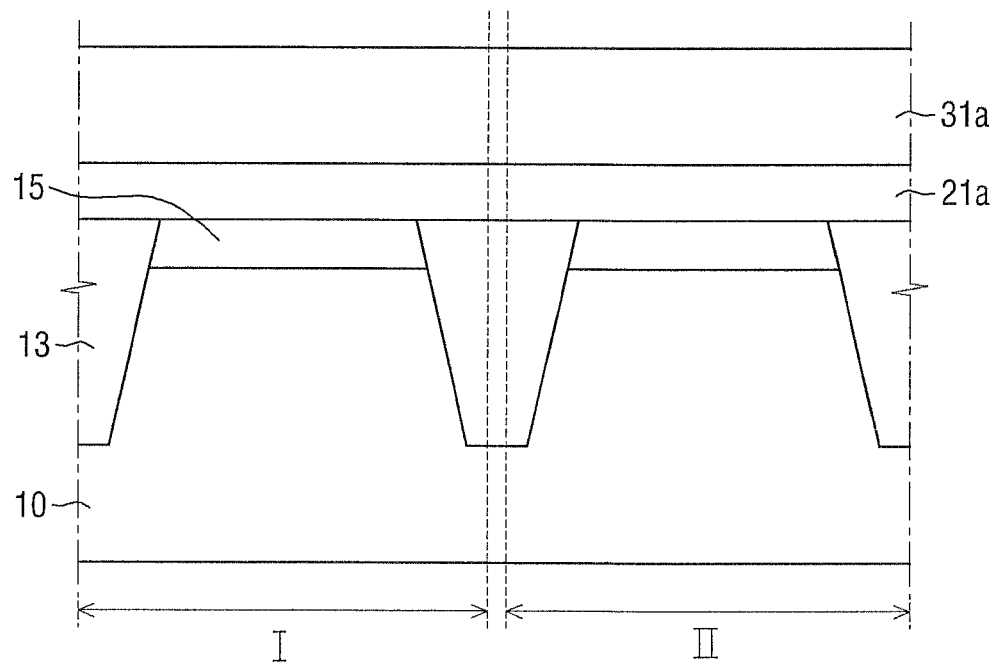

Next, referring to FIGS. 9 and 13, in S250, a first hardmask layer 21a and a second hardmask layer 31a are sequentially formed on the substrate 10. The first hardmask layer 21a is formed on the substrate 10, and the second hardmask layer 31a is formed on the first hardmask layer 21a. The first and second hardmask layers 21a and 31a are formed on the substrate 10 of the first and second regions I and II.

Figure 14:
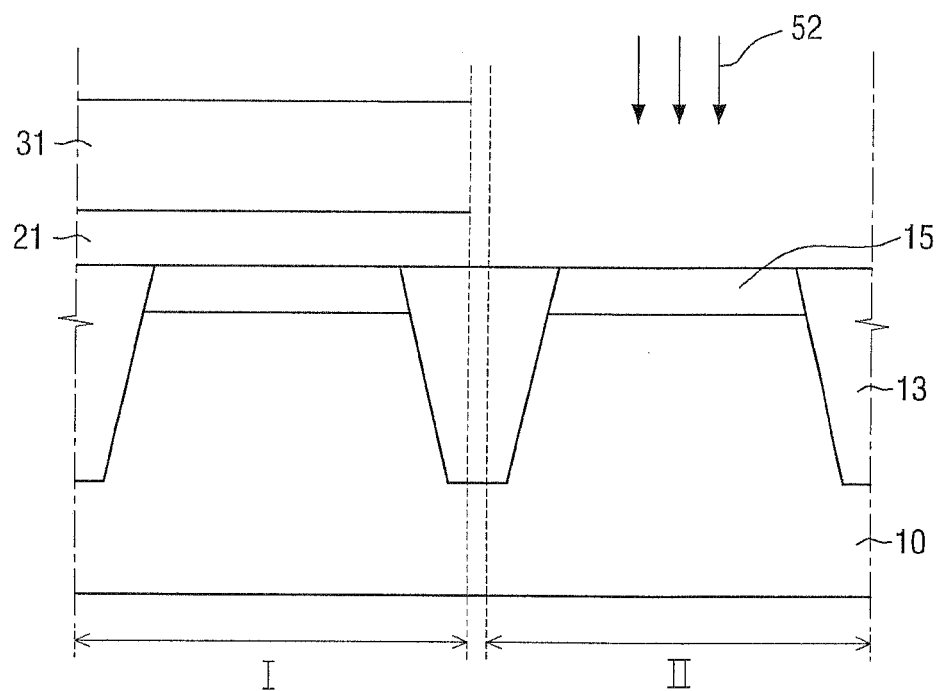

Next, referring to FIGS. 9 and 14, in 5260, the first and second hardmask layers 21a and 31a are sequentially patterned to expose the second region II of the substrate 10. First, the second hardmask layer 31a of the second region II is removed to form a patterned second hardmask layer 31, and the first hardmask layer 21a of the second region II is removed to form a patterned first hardmask layer 21. Consequently, the patterned second hardmask layer 31 and the first hardmask layer 21 expose the second region II of the substrate 10. Each of the second hardmask 31 and the first hardmask layer 21 may be patterned by an RIE process. After the second hardmask 31 is patterned, the first hardmask layer 21 is patterned.

Next, in 5270, second impurity ions are implanted into the exposed substrate 10. Since the exposed portion corresponds to the second region II of the substrate 10, the second impurity ions are implanted into the second region II of the substrate 10 by a second ion implantation process 52. Since the patterned first hardmask layer 21 and the patterned second hardmask layer 31 are formed on the substrate 10 of the first region I, the second impurity ions are not implanted into the substrate 10 of the first region I. The patterned first hardmask layer 21 and the patterned second hardmask layer 31 may serve as an implantation mask for performing the second ion implantation process 52.

The second impurity ions are different from the first ion. For example, the first impurity ions may include n-type impurity, and the second impurity ions may include p-type impurity. If the first impurity ions is n-type impurity, the first region I of the substrate 10 may include an n-type well. If the second ion is p-type impurity, the second region II of the substrate 10 may include a p-type well. Therefore, a PMOS transistor may be formed on the first region I and an NMOS transistor may be formed on the second region II, but aspects of the present inventive concept are not limited thereto. The first ion may include p-type impurity, and the second ion may include n-type impurity.

The second ion implantation process 52 may be performed in substantially the same manner as the first ion implantation process 51, except that the ion implanted is a second ion and the ion is implanted into the second region II of the substrate 10.

Figure 15:
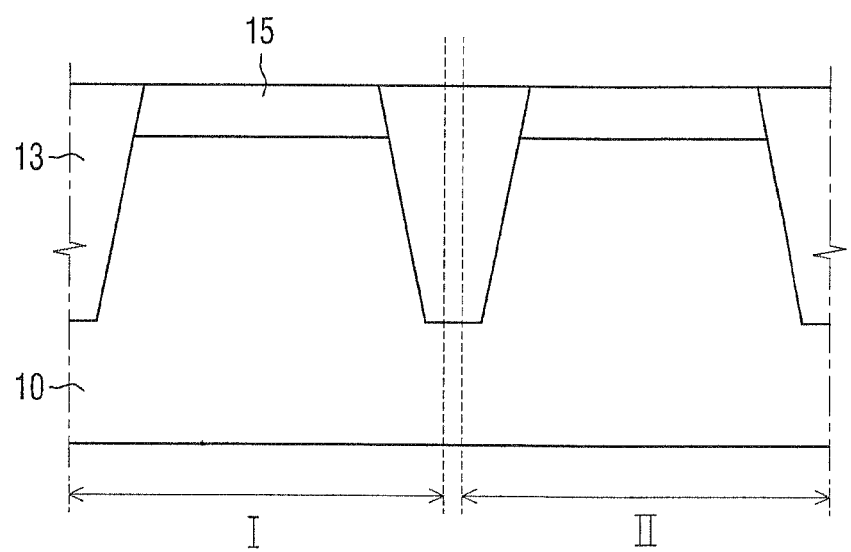

Next, referring to FIGS. 9 and 15, in 5280, the patterned second and first hardmask layers 31 and 21 are sequentially removed by using etching selectivity of the passivation layer 15 with respect to the patterned second and first hardmask layers 31 and 21. For example, the patterned second hardmask layer 31 is removed, and the patterned first hardmask layer 21 is then removed. A wet etching process may be employed to remove the patterned second hardmask layer 31 and the patterned first hardmask layer 21. As described above, materials forming the patterned first hardmask layer 21 and the patterned second hardmask layer 31 are different from each other. Therefore, in the case of using the wet etching process, etchants used to remove the patterned first hardmask layer 21 and the patterned second hardmask layer 31 may be different from each other, as described above. The etchants used to remove the patterned first hardmask layer 21 and the patterned second hardmask layer 31 may leave the passivation layer 15 substantially unetched. Therefore, the substrate 10 is substantially undamaged by the etchant.

In an exemplary embodiment, the patterned first hardmask layer 21 may be removed by an ashing process other than the wet etching process. Like the wet etching process, the ashing process may leave the substrate 10 substantially undamaged.

In the method for fabricating a semiconductor device according to an exemplary embodiment of the present inventive concept, different kinds of impurity ions are implanted into the first region I and the second region II of the substrate 10.

Figure 16:
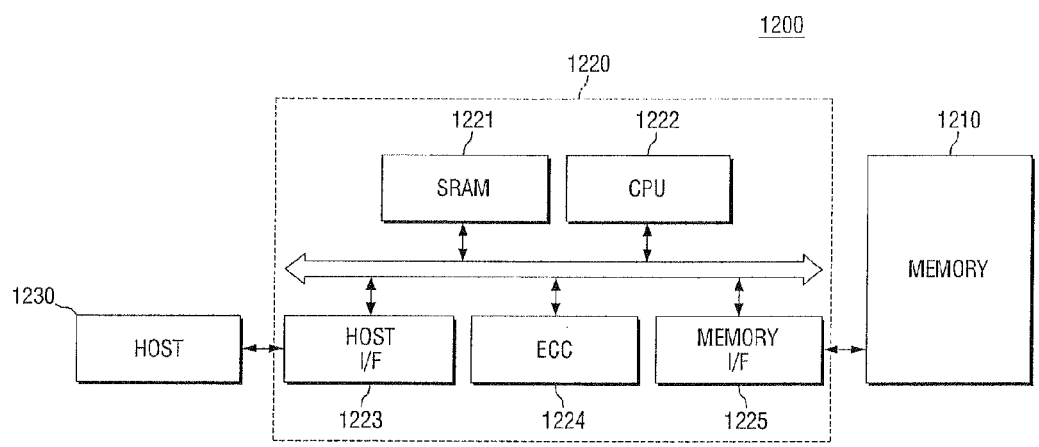
FIG. 16 is a block diagram illustrating an exemplary memory card including a semiconductor device according to an exemplary embodiment of the present inventive concept.

FIG. 16 is a block diagram illustrating an exemplary memory card including a semiconductor device according to an exemplary embodiment of the present inventive concept.

Referring to FIG. 16, a memory including a semiconductor device according to an exemplary embodiment of the present inventive concept may be employed to a memory card 1200. The memory card 1200 may include a memory controller 1220 for general data exchange between a host 1230 and the memory 1210.

A static random access memory (SRAM) 1221 may be used as an operating memory of a central processing unit (CPU) 1222. A host interface (I/F) 1223 includes a data exchange protocol of a host connected to the memory card 1200. An error correction code (ECC) 1224 detects and corrects an error included in data read from the memory 1210. A memory interface (I/F) 1225 may interface with the memory 1210 of the present inventive concept. The CPU 1222 performs general control operations for data exchange of the memory controller 1220.

Figure 17:
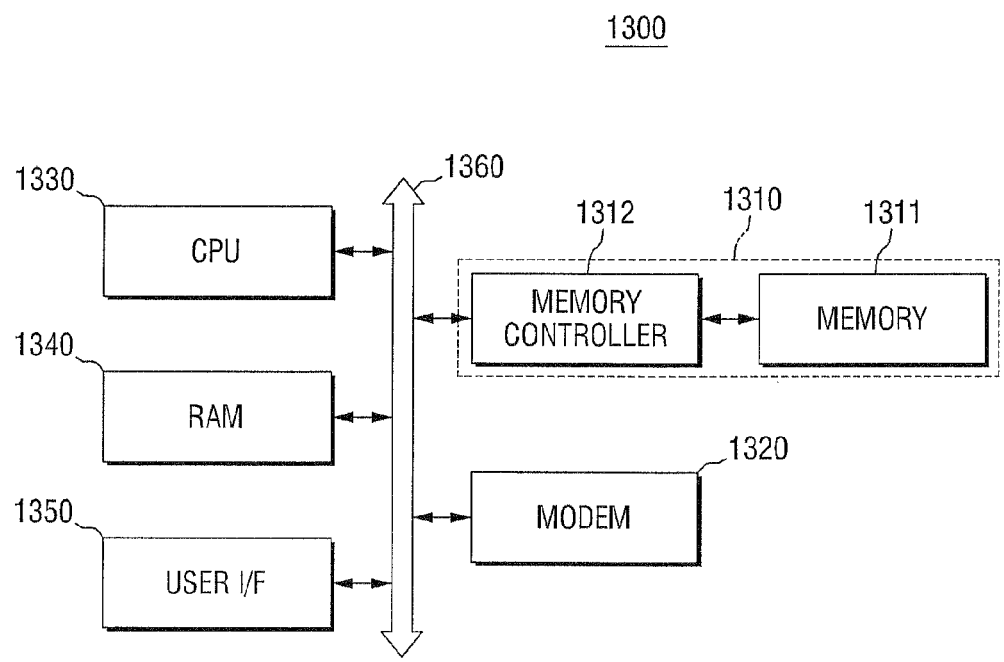
FIG. 17 is a block diagram illustrating an exemplary information processing system including a semiconductor device according to an exemplary embodiment of the present inventive concept.

FIG. 17 is a block diagram illustrating an exemplary information processing system including a semiconductor device according to an exemplary embodiment of the present inventive concept.

Referring to FIG. 17, the information processing system 1300 according to the present inventive concept may include a memory system 1310 having a semiconductor device according to an exemplary embodiment of the present inventive concept. The information processing system 1300 may include a memory system 1310, a modem 1320 CPU 1330, RAM 1340, and a user interface 1350, electrically connected to a system bus 1360.

The memory system 1310 may include a memory 1311 and a memory controller 1312 and may have substantially the same configuration as the memory card 1200 shown in FIG. 9. The memory system 1310 stores data processed by the CPU 1330 or data inputted from the exterior. The information processing system 1300 may be applied to a memory card, a solid-state drive (SSD), a camera image processor (CIS), and other various application chipsets. For example, the memory system 1310 may be configured to be applied to an SSD. In this case, the information processing system 1300 may stably and reliably store high capacity data.

Figure 18:
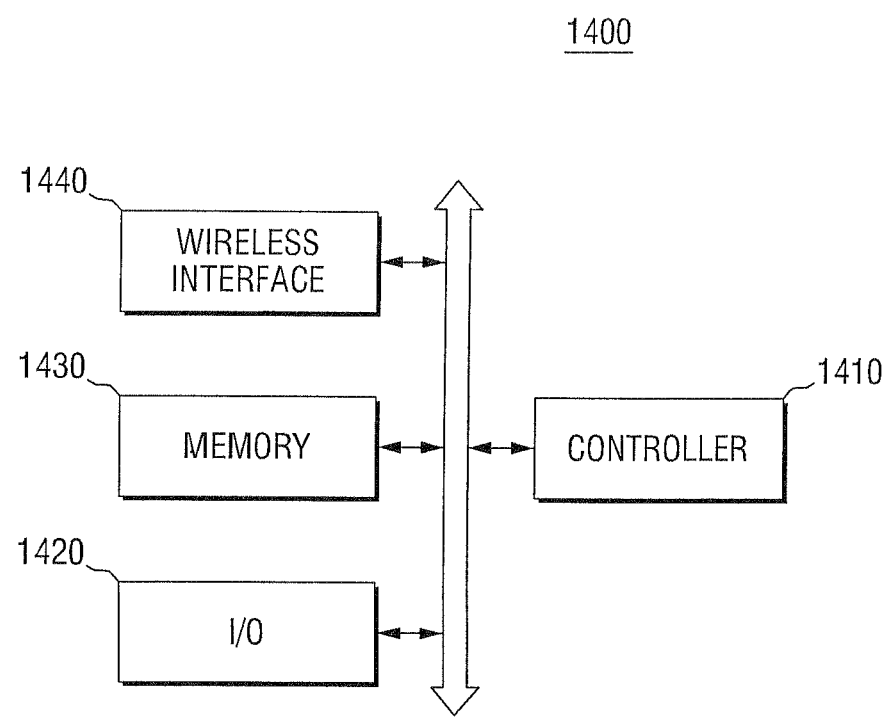
FIG. 18 is a block diagram illustrating an exemplary electronic device including a semiconductor device according to an exemplary embodiment of the present inventive concept.

FIG. 18 is a block diagram of an exemplary electronic device including a semiconductor device according to an exemplary embodiment of the present inventive concept.

Referring to FIG. 18, an exemplary electronic device 1400 may include a semiconductor device according to an exemplary embodiment of the present inventive concept. The electronic device 1400 may be used in a wireless communication system (e.g., a personal digital assistant (PDA), a notebook computer, a portable computer, a web tablet, a wireless phone, or a digital music system) or various information transmitting/receiving systems in wireless communication surroundings.

The electronic device 1400 may include a controller 1410, an input/output (I/O) device 1420, a memory 1430, and a wireless interface 1440. Here, the memory 1430 may include a semiconductor device according to an exemplary embodiment of the present inventive concept. The controller 1410 may include a microprocessor, a digital signal processor, or the like. The memory 1430 may be used in storing commands (or user data) processed by the controller 1410. The wireless interface 1440 may be used in transmitting/receiving data through a wireless a communication network. The wireless interface 1440 may be coupled to the network via a wired or wireless coupling. For example, the wireless interface 1440 may include an antenna or a wired/wireless transceiver. The electronic device 1400 may use a communication interface protocol for third generation communication systems, e.g., Code Division Multiple Access (CDMA), Global System for Mobile Communications (GSM), North American Digital Cellular (NADC), Extended-Time Division Multiple Access (E-TDMA), Wideband Code Division Multiple Access (WCDMA), and CDMA2000.

While the present inventive concept has been shown and described with reference to exemplary embodiments thereof, it will be apparent to those of ordinary skill in the art that various changes in form and detail may be made therein without departing from the sprit and scope of the inventive concept as defined by the following claims

What is claimed is:

1. A method for fabricating a semiconductor device, comprising:
sequentially forming first and second hardmask layers on a substrate, wherein the first hardmask layer includes a material different from the second hardmask layer;
exposing a portion of the substrate by patterning the first and second hardmask layers through a first etching process;
performing an ion implantation process on the exposed portion of the substrate; and
removing the patterned second and first hardmask layers using a second etching process different from the first etching process while the substrate is exposed.

2. The method of claim 1, wherein the first etching process includes a reactive ion etching (RIE) process.

3. The method of claim 1, wherein the first hardmask layer includes a spin on hardmask (SOH) or a carbon polymer layer.

4. The method of claim 1, wherein the second etching process includes a wet etching process.

5. The method of claim 4, wherein the second hardmask layer includes SiN.

6. The method of claim 5, wherein the wet etching process includes using an etchant including $H_3PO_4$ and Si in an amount of 100 ppm or greater.

7. The method of claim 4, wherein the second hardmask layer includes amorphous silicon or polysilicon.

8. The method of claim 7, wherein the wet etching process includes using an etchant including at least one of $NH_4OH$, tetramethyl ammonium hydroxide (TMAH), or tetraethyl ammonium hydroxide (TMEH).

9. The method of claim 4, wherein an etchant used to remove the patterned second hardmask layer includes $H_2SO_4$.

10. The method of claim 1, wherein the substrate further includes a passivation layer formed on a top surface of the substrate.

11. The method of claim 1, wherein the patterning of the second hardmask layer comprises forming a photoresist layer thereon and patterning the photoresist layer, and patterning the second hardmask layer using the patterned photoresist layer as an etch mask, wherein the patterned photoresist layer is simultaneously removed when the second hardmask layer is patterned.

12. A method for fabricating a semiconductor device, comprising:
sequentially forming first and second hardmask layers on a semiconductor substrate having a passivation layer formed on top surfaces of the semiconductor substrate in first and second regions, wherein the first hardmask layer includes a material different from the second hardmask layer;
patterning the first and second hardmask layers to expose the passivation layer in the first region, wherein the patterned first and second hardmask layers cover the passivation layer in the second region;
implanting first impurity ions into the substrate using the patterned first and second hardmask layers as an implantation mask; and
removing the patterned second and first hardmask layers by using an etchant having etching selectivity of the patterned second and first hardmask layers with respect to the passivation layer.

13. The method of claim 12, after sequentially removing the patterned second and first hardmask layers, further comprising:
sequentially forming third and fourth hardmask layers on the substrate;
patterning the third and fourth hardmask layers to expose the passivation layer in the second region, wherein the patterned third and fourth hardmask layers cover the passivation layer in the first region;
implanting second impurity ions different from the first ion into the substrate using the patterned third and fourth hardmask layers as an implantation mask; and
removing the patterned second and first hardmask layers by using an etchant having etching selectivity of the patterned third and fourth hardmask layers with respect to the passivation layer.

14. The method of claim 13, wherein the first impurity ions include an n-type impurity and the second impurity ions include a p-type impurity.

15. The method of claim 12, wherein a reactive ion etching (RIE) process is used in patterning the first and second hardmask layers and a wet etching process is used in removing the patterned second and first hardmask layers.

16. A method for fabricating a semiconductor device, comprising:
forming an ion implantation mask exposing a portion of a semiconductor substrate on the semiconductor substrate, wherein the implantation mask includes a first hardmask layer having a first thickness and a second hardmask layer having a second thickness, and the first hardmask layer is disposed between the second hardmask layer and the semiconductor substrate;
performing an ion implantation process on the exposed portion of the semiconductor substrate using the implantation mask; and
removing the implantation mask without forming an etch mask layer on the exposed portion of the semiconductor substrate.

17. The method of claim 16, wherein the ion implantation process is performed using an RIE process.

18. The method of claim 17, wherein the implantation mask is removed by a first wet etching process using a first etchant having etching selectivity of the second hardmask layer with respect to the passivation layer and a second wet etching process using a second etchant having etching selectivity of the first hardmask layer with respect to the passivation layer, wherein the first etchant includes $H_3PO_4$ and Si in an amount of 100 ppm or greater and the second etchant includes $H_3PO_4$, wherein the second wet etching is performed at a relatively high temperature.

19. The method of claim 16, wherein the first hardmask layer includes at least a spin on hardmask (SOH) and a carbon polymer layer and the first thickness of the first hardmask layer has about 50 nm or less.

20. The method of claim 19, wherein the second hardmask layer includes at least SiN, amorphous silicon and polysilicon and the second thickness of the second hardmask layer has about 200 nm or less.

* * * * *